US006876602B2

(12) United States Patent
Ichikawa et al.

(10) Patent No.: US 6,876,602 B2
(45) Date of Patent: Apr. 5, 2005

(54) ELECTRONIC TIMEPIECE, INFORMATION PROCESSING DEVICE, METHOD OF DISPLAYING CHARGED CONDITION OF SECONDARY CELL, AND COMPUTER PRODUCT

(75) Inventors: Masakazu Ichikawa, Souka (JP); Isao Kitazawa, Tokyo (JP); Masao Sakuyama, Tokorozawa (JP); Tomio Okigami, Higashimurayama (JP)

(73) Assignee: Citizen Watch Co., Ltd., Tokyo (JP)

( * ) Notice: Subject to any disclaimer, the term of this patent is extended or adjusted under 35 U.S.C. 154(b) by 241 days.

(21) Appl. No.: 10/368,012

(22) Filed: Feb. 19, 2003

(65) Prior Publication Data

US 2003/0235117 A1 Dec. 25, 2003

(30) Foreign Application Priority Data

Feb. 18, 2002 (JP) ....................................... 2002-039556
Feb. 7, 2003 (JP) ....................................... 2003-031301

(51) Int. Cl.[7] ................................................ G01R 31/36
(52) U.S. Cl. ......................... 368/205; 368/66; 368/108; 320/149; 320/DIG. 21
(58) Field of Search .......................... 368/66, 204, 205, 368/108; 320/DIG. 18, DIG. 21, 132, 149, 155, 157; 324/435, 436

(56) References Cited

U.S. PATENT DOCUMENTS

| | | | | | |
|---|---|---|---|---|---|
| 5,345,163 | A | * | 9/1994 | Gibbons et al. | 320/163 |
| 5,459,671 | A | * | 10/1995 | Duley | 702/63 |
| 5,648,717 | A | * | 7/1997 | Uskali | 324/428 |
| 5,699,322 | A | * | 12/1997 | Born | 368/66 |
| 5,889,734 | A | * | 3/1999 | Sato | 368/64 |
| 6,061,304 | A | * | 5/2000 | Nagata et al. | 368/66 |
| 6,069,846 | A | * | 5/2000 | Nagata | 368/64 |
| 6,147,936 | A | * | 11/2000 | Nakajima | 368/205 |
| 6,630,852 | B2 | * | 10/2003 | Fujisawa et al. | 327/198 |
| 6,646,960 | B1 | * | 11/2003 | Nagata | 368/204 |

FOREIGN PATENT DOCUMENTS

JP 64-15679 A 1/1989

* cited by examiner

*Primary Examiner*—Andrew H. Hirshfeld
*Assistant Examiner*—Leo T. Hinze
(74) *Attorney, Agent, or Firm*—Foley & Lardner LLP

(57) ABSTRACT

A first voltage detector detects whether the voltage of a secondary cell has reached to 1.2V and a first timer counts a time duration for which the voltage is equal to or above 1.2V. If the time counted by the first timer reaches one hour, a second timer starts counting time for one hour. An amount of charge accumulated in the secondary cell is displays after counting of the one hour by the second timer is over. As a result, an accurate display of the amount of charge accumulated in the secondary cell can be achieved.

14 Claims, 12 Drawing Sheets

ELECTRONIC TIMEPIECE, INFORMATION PROCESSING DEVICE, METHOD OF DISPLAYING CHARGED CONDITION OF SECONDARY CELL, AND COMPUTER PRODUCT

BACKGROUND OF THE INVENTION

1) Field of the Invention

The present invention relates to an electronic timepiece and an information-processing terminal that has a secondary cell that displays how much charge is accumulated (hereinafter "accumulated condition") of the secondary cell.

2) Description of the Related Art

Electronic timepieces (watches) that have functions of power generation such as photovoltaic power generation and mechanical power generation are known in the art. These electronic timepieces have a secondary cell for accumulating power supplied from a power supply (hereinafter "power supplier"). The power supply is, for example, a power generator such as a solar cell or a charger. The secondary cell is employed to accumulate power output from the power supplier to operate a timepiece circuit. The technology is advancing fast and secondary cells with much larger accumulation capacities are being developed.

FIG. 12 is a graph that shows a relation between accumulation capacity and voltage with time during charging of a secondary cell. The accumulation capacity of, for example, 1000 $\mu$Ah means that the amount of accumulated charge that can be discharged for one hour at a constant-current discharge is 1000 $\mu$Ah.

In FIG. 12 it is assumed that a solar cell supplies power to the secondary cell. The solar cell is exposed under a brightness of 40,000 luxes (like outdoors in slightly cloudy weather). As shown by a one-dot-broken-line in FIG. 12, the amount of accumulated charge increases almost in proportion to the time elapsed after the end of power supply. A cell voltage shown with a dotted line also increases almost in proportion to the charging time. Therefore, the amount of charge accumulated in the secondary cell can be generally estimated based on the cell voltage. The amount of charge accumulated in a cell is often estimated by simply detecting the cell voltage.

However, lithium-ion secondary cell that is generally used in electronic timepieces and the like causes a phenomenon called polarization. Polarization is the phenomenon wherein the cell charged with relatively large current causes only the cell voltage to elevate without accumulating the charge sufficiently and therefore disturb the relation of voltage with the amount of accumulated charge. The full-charge condition of the cell is thus wrongly detected and the charging operation is terminated. As a result, the secondary cell can not be electrically charged sufficiently. To solve the problem, such a technology is disclosed that detects a certain voltage continuously for a constant time in order to determine if it has reached a certain value of voltage (see Japanese Patent Application Laid-Open No. 1-15679).

As the secondary cells advance extremely as explained above, a similar-size cell with a larger accumulation capacity is developed and brought to the commercial stage one after another. The dotted line in FIG. 12 shows a variation in the amount of charge accumulated in the secondary cell having a larger accumulation capacity compared to the conventional cell. The conventional cell achieves 4000 $\mu$Ah while the new product can achieve 25% more or 5000 $\mu$Ah.

The cell voltage variation curve in the conventional art has no large variation and remains almost similar. Therefore, when the conventional detection system is employed for detecting the amount of accumulated charge, it displays a full-charge indication even before the secondary cell is fully charged. Such electronic timepiece has limitations in the maximum voltage rating of the secondary cell and the highest voltage to drive a motor for analog timepieces. Therefore, when the secondary cell voltage reaches a certain voltage (about 2.2V), an overcharge protector is activated to prevent the voltage from elevating above the certain voltage.

The cell voltage variation curve shown in FIG. 12 includes a waved part, which indicates operation of the overcharge protector. When a voltage above 2.2V is detected during intermittent detection of the cell voltage, the power supplied from the power supplier to the secondary cell is cut off to control the cell voltage so as not to greatly exceed the certain voltage. Accordingly, no charge is accumulated in the secondary cell during operation of the overcharge protector.

As can be seen from FIG. 12, there is no problem in the conventional secondary cell because the overcharge protector starts its operation when the cell is close to an almost full-charge condition. On the contrary, in the case of the secondary cell with a larger capacity, the overcharge protector reduces the supply of charge before the charge is accumulated sufficiently. Therefore, it is difficult to determine an amount of accumulated charge merely based on the cell voltage and time as in the conventional art.

This problem can be solved if the overcharge protector can operate at a higher voltage. The value of the voltage can not be changed easily, however, because it depends on a rating of the cell and a threshold voltage for driving the motor.

When a cell having a larger accumulation capacity is employed, a correct full-charge condition can not be detected and displayed due to the above background unless the voltage detection system is changed or the motor is changed to increase the drive voltage. This change causes a considerable cost-up, which results in a large problem for advancing to the commercial stage.

SUMMARY OF THE INVENTION

It is an object of the present invention to solve at least the problems in the conventional technology.

The electronic timepiece according to one aspect of the present invention comprises a secondary cell; a power supplier that supplies power to the secondary cell; a voltage detector that detects a voltage of the secondary cell; a first timer that starts counting time from an instant when the voltage of the secondary is equal to a first voltage and counts the time until the voltage of the secondary cell is equal to or more than the first voltage; a second timer that starts counting time from an instant when the time counted by the first timer reaches a first time and counts the time until a second time; and a display unit that displays a charge accumulated condition of the secondary cell based on the second time.

The method of displaying an amount of charge accumulated in a secondary cell according to still another aspect of the present invention comprises detecting a voltage of the secondary cell; a first step of starting counting of time from an instant when the voltage of the secondary cell reaches a first voltage and counting the time until the voltage of the secondary cell is equal to or more than the first voltage; a second step of starting counting of time from an instant when the time counted in the first step has reached a first time and counting the time until a second time; and displaying the amount of charge accumulated in the secondary cell based on the second time.

The computer program according to still another aspect of the present invention contains instructions which when executed on a computer realize the method of displaying an amount of charge accumulated in a secondary cell according to the above aspect.

The information processing device according to still another aspect of the present invention comprises a secondary cell; a power supplier that supplies power to the secondary cell; a voltage detector that detects a voltage of the secondary cell; a first timer that starts counting time from an instant when the voltage of the secondary is equal to a first voltage and counts the time until the voltage of the secondary cell is equal to or more than the first voltage; a second timer that starts counting time from an instant when the time counted by the first timer reaches a first time and counts the time until a second time; and a display unit that displays a charge accumulated condition of the secondary cell based on the second time.

These and other objects, features and advantages of the present invention are specifically set forth in or will become apparent from the following detailed descriptions of the invention when read in conjunction with the accompanying drawings.

DETAILED DESCRIPTION

Exemplary embodiments of the electronic timepiece, an information-processing terminal, method of displaying an accumulated condition of a secondary cell, and a computer product according to the present invention will be explained below with reference to the drawings.

Figure 1:
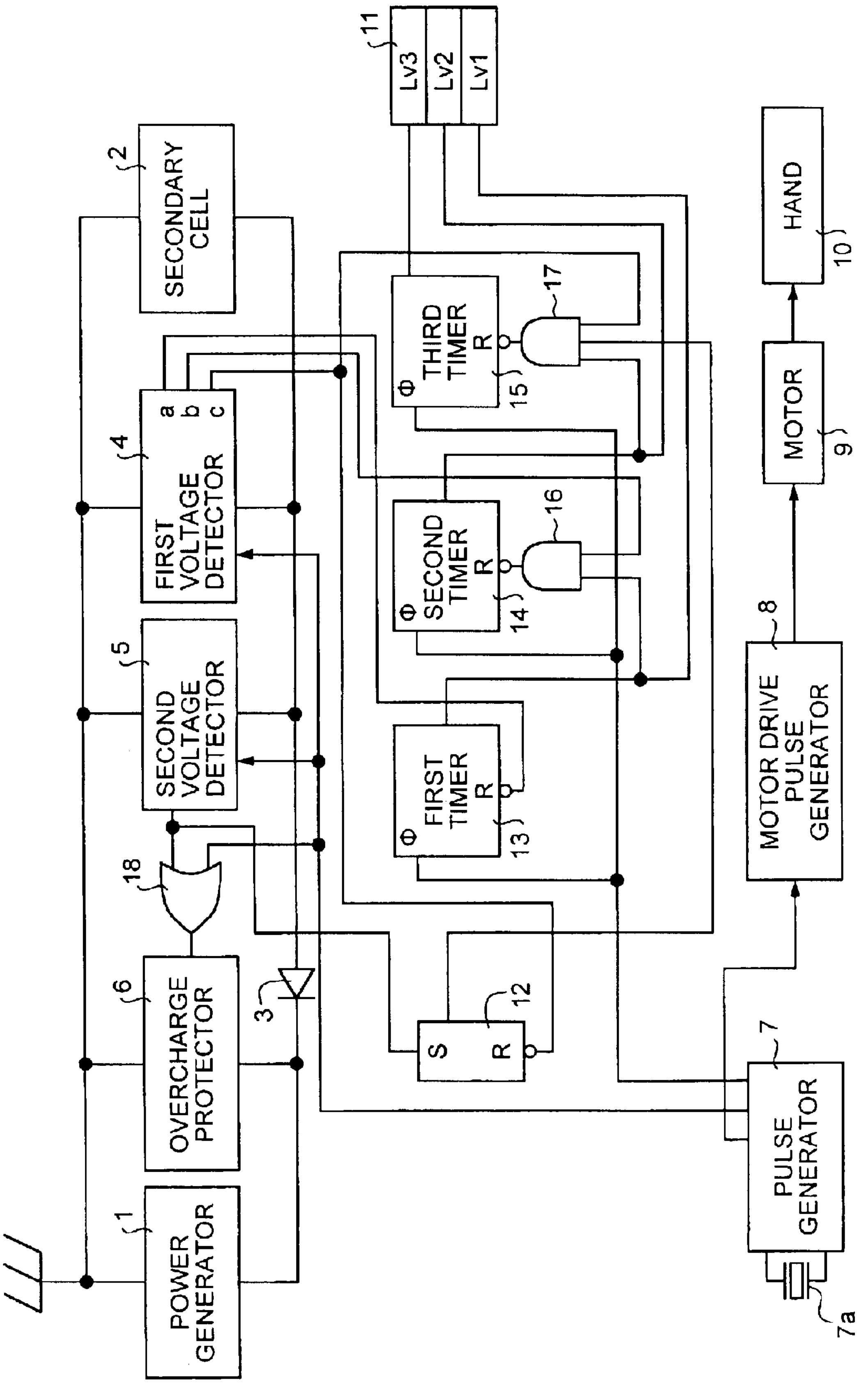
FIG. 1 is a block diagram that shows an arrangement of an electronic timepiece according to an embodiment of the present invention.

An arrangement of the electronic timepiece according to the embodiment of the present invention is explained first. FIG. 1 is a block diagram that shows the arrangement of the electronic timepiece. In FIG. 1, the reference numeral 1 denotes a power generator such as a photovoltaic power generator (solar cell). A secondary cell such as a lithium-ion secondary cell is denoted with 2. A reverse-current protection diode 3 is employed to prevent a reverse current from flowing out of the secondary cell 2 when an output voltage from the power generator 1 is low. A first voltage detector 4 detects the voltage on the secondary cell 2 and outputs a signal of high logical level (hereinafter "H") from a-c terminals on detection of 1.2V, 1.5V and 1.8V, respectively. A second voltage detector 5 outputs a signal of "H" level as an overcharge protection signal when it detects 2.2V on the secondary cell 2. An overcharge protector 6 prevents the overcharge of the secondary cell 2 based on the signal of "H" level (the overcharge protection signal) output from the second voltage detector 5.

A pulse generator 7 is provided with a crystal oscillator **7*a* to generate pulse signals with various frequencies. A motor drive pulse generator 8 creates a motor drive signal based on a certain pulse signal received from the pulse generator 7. A motor is denoted by 9. A hand 10 is driven by the motor 9 through a reduction train, not shown, to indicate a time and the like. An accumulated condition display section 11 displays an accumulated condition of the secondary cell 2**.

A set/reset flip-flop (hereinafter "SRFF") 12 is set when the overcharge protector 6 starts operating, and is kept reset unless the first voltage detector 4 detects 1.8V. In other words, it is a circuit for memorizing the fact that the overcharge protector 6 starts operating after the voltage on the secondary cell 2 exceeds 1.8V. A first timer 13 outputs a signal of "H" level when one hour elapses after the first voltage detector 4 detects 1.2V. A second timer 14 outputs a signal of "H" level after the first timer 13 detects the signal of "H" level and when one hour elapses after the first voltage detector 4 detects 1.5V. A third timer 15 outputs a signal of "H" level after the SRFF 12 and the second timer 14 output the signals of "H" level and when two hours elapse after the first voltage detector 4 detects 1.8V. AND gates are denoted by 16, 17 and an OR gate by 18. The timers 13 to 15 may have a count time arbitrarily determined each in accordance with a characteristic of the secondary cell 2, for example.

The first voltage detector 4 and the second voltage detector 5 operate on intermittent voltage detection based on a sampling signal (a signal of "H" level) from the pulse generator 7. For example, they operate on the voltage detection for several milliseconds every two seconds. Based on the results previously detected, they hold the outputs until the next detection timing comes. The overcharge protector 6 is activated during the voltage detection timing to prevent the power generator 1 from supplying power to the secondary cell 2. Thus, the power generator 1 is isolated from the secondary cell 2 during the voltage detection to reduce the influence from the polarization as much as possible.

Specifically, the signal of "H" level (overcharge protection signal) is output from the second voltage detector 5, and the sampling signal is fed to the first voltage detector 4 and the second voltage detector 5 from the pulse generator 7. When either one of these signals of "H" level is input to the OR gate 18, a signal of "H" level is supplied to the overcharge protector 6 to activate the overcharge protector 6.

Figure 2:
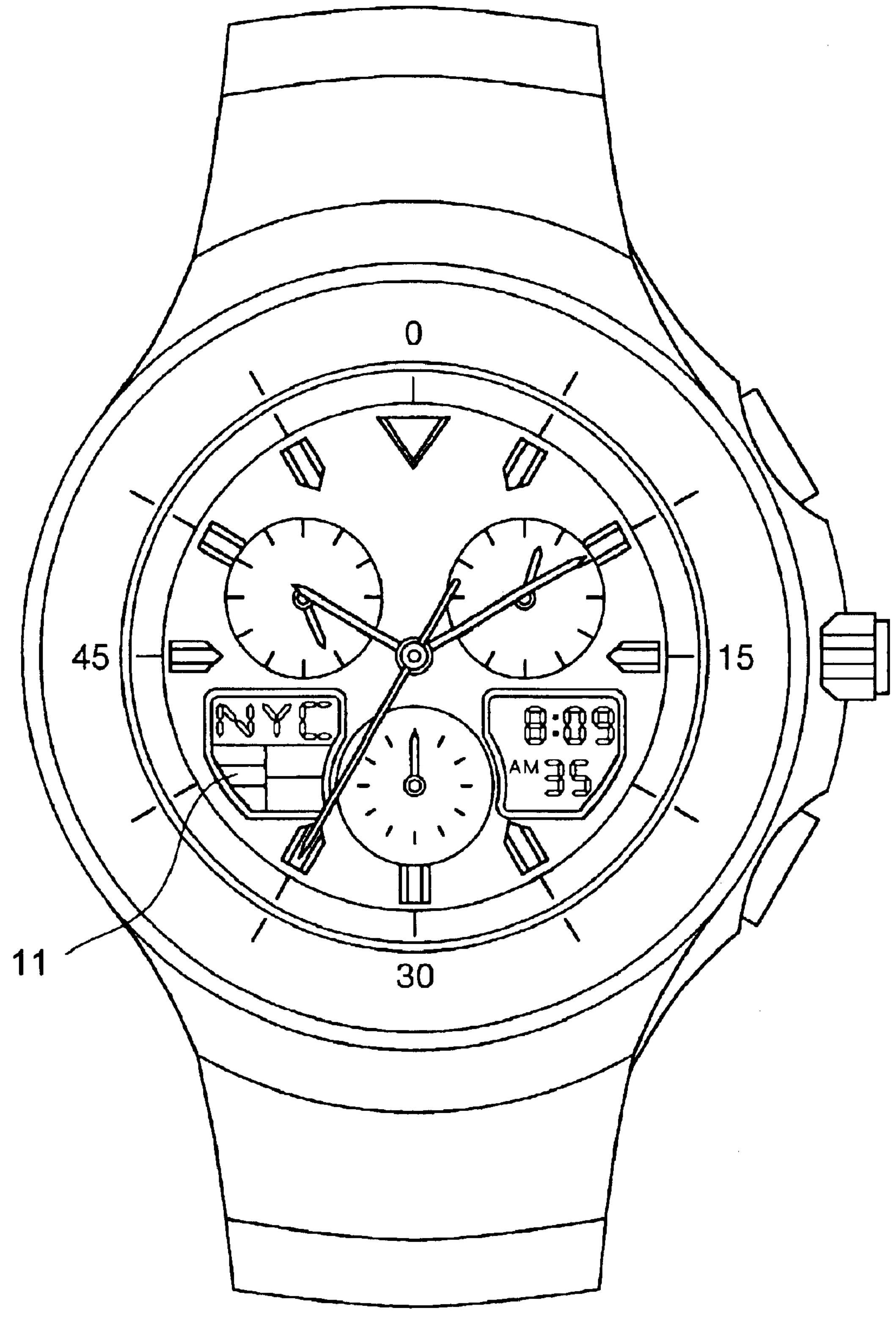
FIG. 2 is a top view of the electronic timepiece according to the embodiment.
Figure 3:
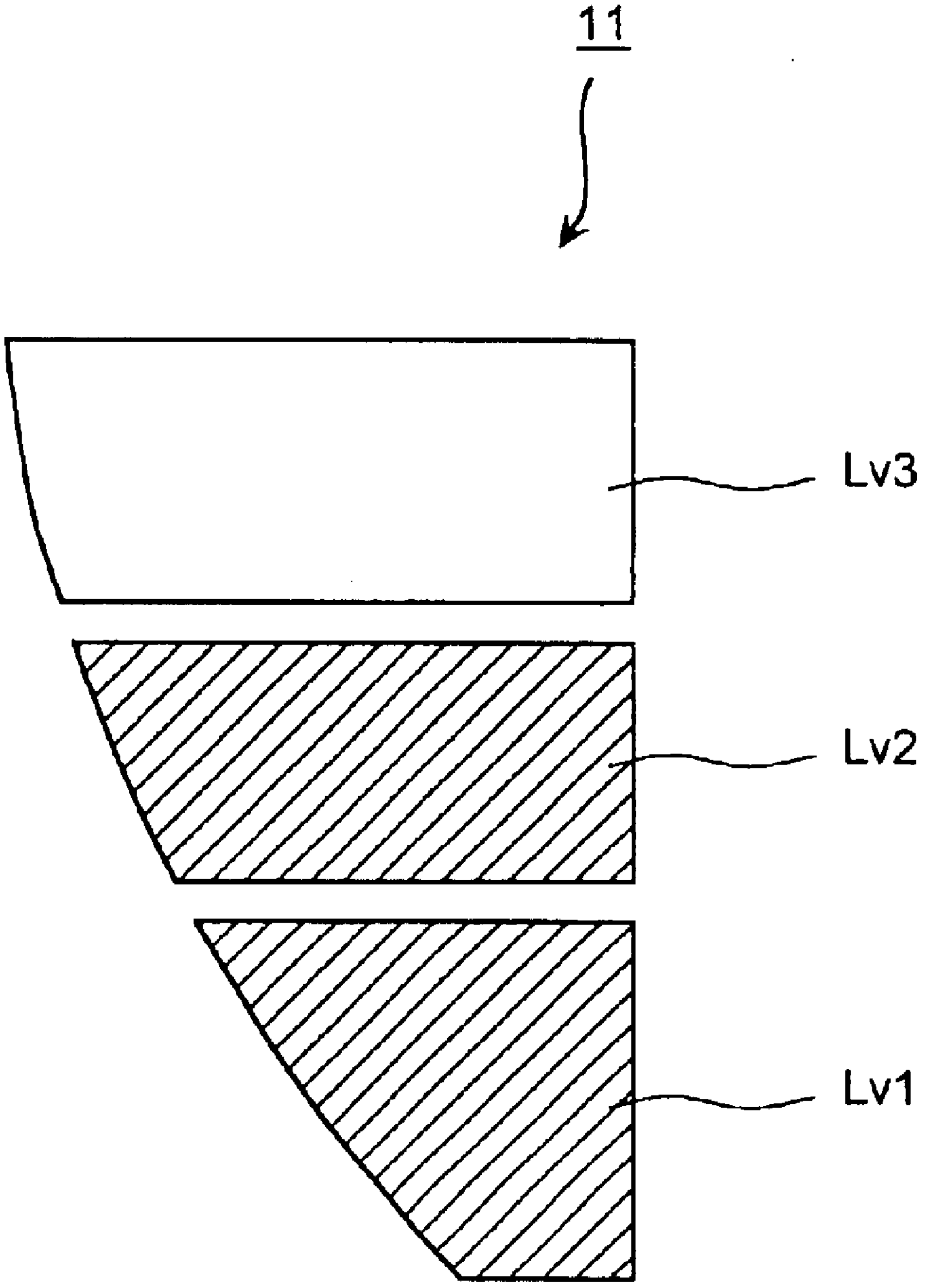
FIG. 3 is an illustrative view that shows an accumulated condition display section in the electronic timepiece shown in FIG. 1.

An arrangement of the accumulated condition display section 11 is explained next. FIG. 2 is a top view that shows an appearance of the electronic timepiece shown in FIG. 1. In FIG. 2, the accumulated condition display section 11 is shown as a part in a liquid crystal display screen located at the lower left side on a display board of the electronic timepiece. FIG. 3 is an illustrative view that shows the accumulated condition display section in the electronic timepiece shown in FIG. 1, and that shows only the part of the accumulated condition display section 11. The accumulated condition display section 11 consists of three display zones (Lv1, Lv2, and Lv3), for example.

If Lv1, Lv2, and Lv3 are all turned on, the accumulated condition display section 11 indicates that the secondary cell 2 has an amount of accumulated charge at a level 3 or in a full-charge condition. If Lv3 is turned off and only Lv1 and Lv2 are turned on, it indicates a level 2. The amount of accumulated charge at the level 2 is less than that at the level 3. If only Lv1 is turned on, it indicates a level 1. The amount of accumulated charge at the level 1 is less than that at the level 2. If Lv1, Lv2, and Lv3 are all turned off, it indicates that the amount of accumulated charge is almost zero or "0". FIG. 3 shows a state (level 2) in which only Lv1 and Lv2 are turned on and Lv3 is turned off. It can be found at a glance that the cell is not yet fully charged in this state.

A summary of the operation of the electronic timepiece shown in FIG. 1 is explained next. According to the nature of the present invention, the explanation is started with the assumption that there is no accumulated charge in the secondary cell 2. In this state, all parts in the arrangement halt operating. When the power generator 1 begins power generation, the power is gradually accumulated in the secondary cell 2. When the voltage on the secondary cell 2 reaches about 1.1V, an oscillator (not shown) in the pulse generator 7 initiates oscillating, and the motor 9 drives the hand 10 to start running. The outputs from the first voltage detector 4 are all at "L" level. Therefore, the timers 13 to 15 are reset, and the accumulated condition display section 11 is entirely turned off.

As the amount of charge accumulated in the secondary cell 2 increases and when the voltage reaches 1.2V, the first voltage detector 4 outputs the signal of "H" level from the a-terminal in response to the timing output from the pulse generator 7. Therefore, the first timer 13 starts operating. When one hour elapses after the first timer 13 receives the signal from the pulse generator 7, it outputs the signal of "H" level. In other words, if the voltage above 1.2V on the secondary cell 2 is detected continuously for one hour, it outputs the signal of "H" level. This signal is fed to the Lv1 terminal of the accumulated condition display section 11, that turns on "Lv1" only. Accordingly, the user can identify that the state of power in the secondary cell 2 has come to the level 1.

When the voltage on the secondary cell 2 rises to 1.5V, the first voltage detector 4 outputs the signal of "H" level from the b-terminal. Accordingly, the reset of the second timer 14 is cancelled through the AND gate 16. When second timer 14 measures one hour like the first timer 13, it outputs the signal of "H" level to turn on "Lv2" in the accumulated condition display section 11. Accordingly, the user can identify that the amount of charge accumulated in the secondary cell 2 has come to the level 2.

The reset of the second timer 14 can not be cancelled unless the outputs from the first voltage detector 4 and the first timer 13 fed to its reset (R) terminal both come to "H" level. This is effective to control "Lv2" not to be turned on immediately after "Lv1" is turned on due to a sharp voltage elevation. In this case, the user may think that the accumulation capacity of the secondary cell 2 is generally full, and possibly terminate the power generation. As a result, the indication of "Lv2" is turned off in a short time and the user may possibly be confused.

When the voltage on the secondary cell 2 rises to 1.8V, the first voltage detector 4 outputs the signal of "H" level from the c-terminal. The reset of the third timer 15 can not be cancelled unless the outputs from the first voltage detector 4, the second timer 14 and the SRFF 12 all come to "H" level. The output from the SRFF 12 at this moment is "L" level and accordingly the third timer 15 can not start operating.

When the voltage on the secondary cell 2 rises to 2.2V, the second voltage detector 5 outputs the signal of "H" level. This signal activates the overcharge protector 6, which in turn cuts off the power generated by the power generator 1. Thus, the voltage on the secondary cell 2 can not elevate much higher. When the output from the second voltage detector 5 comes to "H" level, it sets the SRFF 12 to output a signal of "H" level. As a result, the reset of the third timer 15 can be cancelled. If this state is kept continuously for two hours, the output from the third timer 15 comes to "H" level, that turns on the indication of "Lv3" in the display section 11. Accordingly, the user can identify that the amount of charge accumulated in the secondary cell 2 has come to the level 3 or a full-charge condition.

When the overcharge protector 6 operates and lowers the voltage on the secondary cell 2 below 1.8V, the SRFF 12 is reset and the third timer 15 is initiated. Therefore, the full-charge indication can not be executed even if the polarization in the secondary cell 2 simply elevates an apparent voltage.

Figure 4:
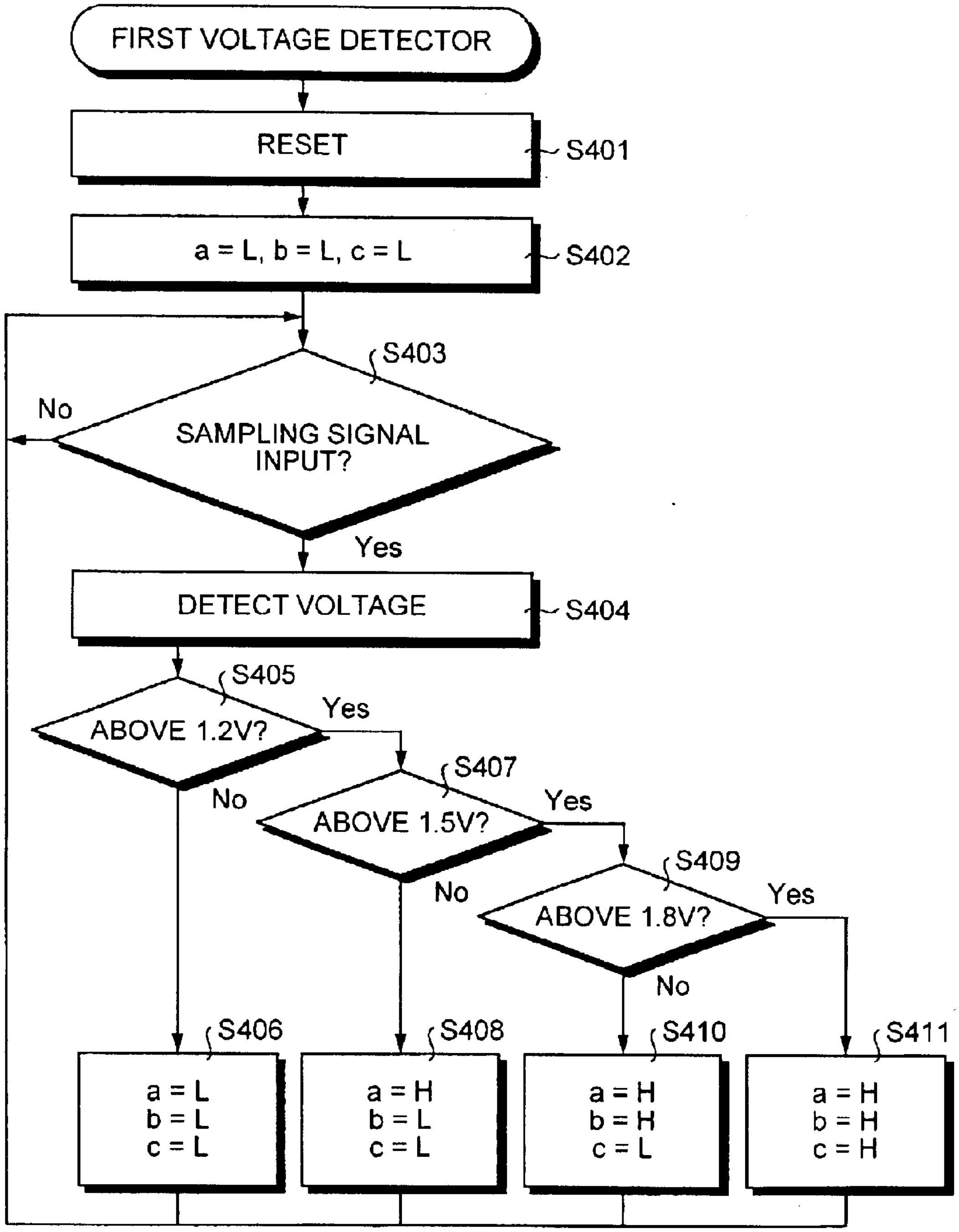
FIG. 4 is a flowchart that shows operation of a first voltage detector in the electronic timepiece shown in FIG. 1.

Operation of the voltage detector is explained in detail. FIG. 4 is a flowchart that shows operation of the first voltage detector 4 in the electronic timepiece shown in FIG. 1. In the flowchart of FIG. 4, the first voltage detector 4 is reset first (step S401) to output signals of "L" level from all output terminals (a, b and c) (step S402).

It is then determined if a sampling signal is input from the pulse generator 7 (step S403). If the sampling signal is input during standby (step S403: Yes), voltage of the secondary cell 2 is detected (step S404). It is determined if the voltage detected is higher than or equal to (hereinafter "above") 1.2V (step S405). If the voltage is lower than (hereinafter "below") 1.2V (step S405: No), signals of "L" level are output from all output terminals (step S406), then the control returns to the step S403.

At the step S405, if the voltage is above 1.2V (step S405: Yes), then it is determined if the voltage detected is above 1.5V (step S407). If the voltage is below 1.5V (step S407: No), a signal of "H" level is output from the a-terminal and signals of "L" level from the b- and c-terminals (step S408), then the control returns to the step S403.

At the step S407, if the voltage is above 1.5V (step S407: Yes), then it is determined if the voltage detected is above 1.8V (step S409). If the voltage is below 1.8V (step S409: No), signals of "H" level are output from the a- and b-terminals and a signal of "L" level from the c-terminal (step S410), then the control returns to the step S403. On the other hand, at the step S409, if the voltage is above 1.8V (step S409: Yes), then signals of "H" level are output from all output terminals (a-, b- and c-terminals) (step S411), then the control returns to the step S403. Thus, the signals of "H" level are output from the output terminals of the first voltage detector 4 based on the detected voltage.

Figure 5:
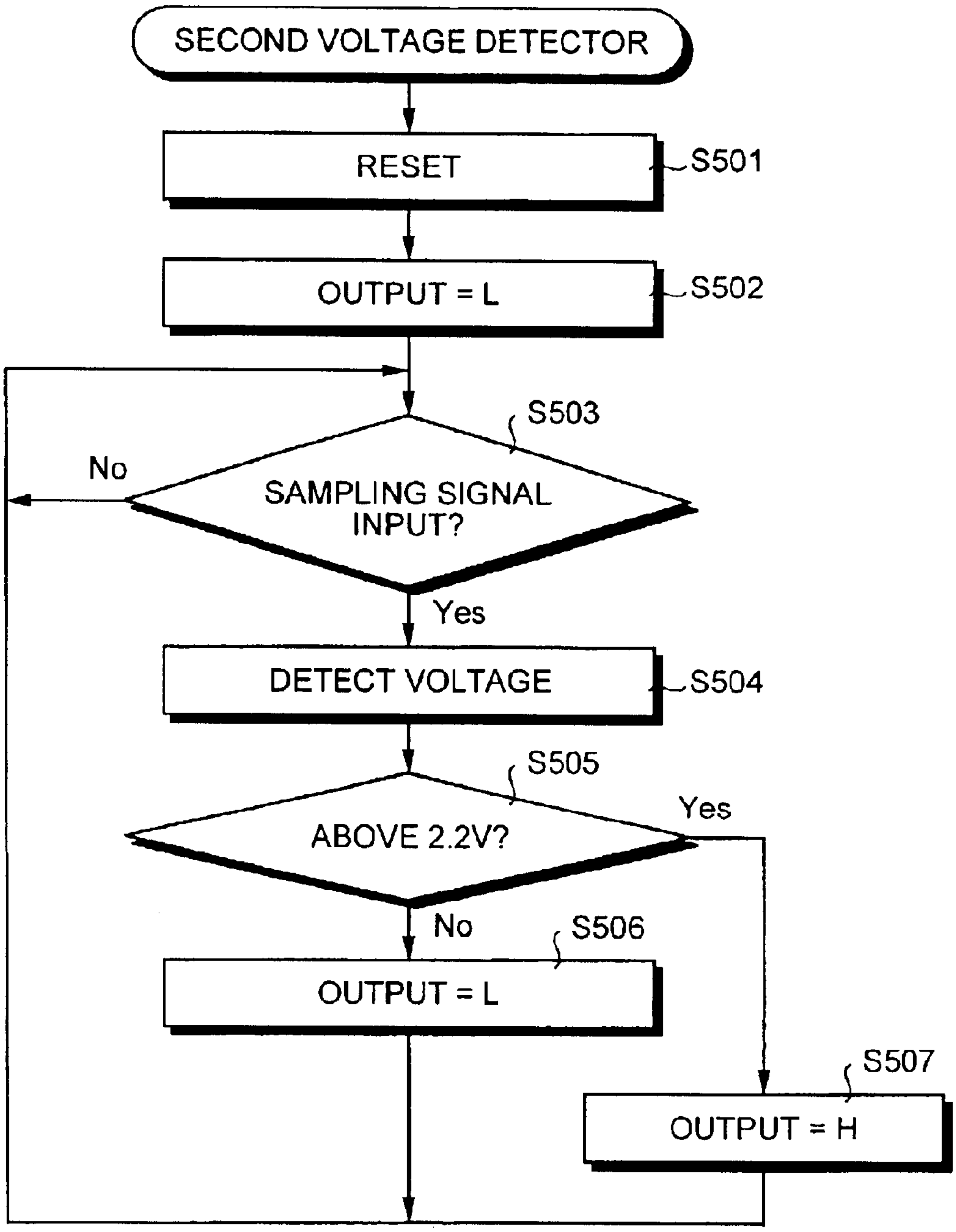
FIG. 5 is a flowchart that shows operation of a second voltage detector in the electronic timepiece shown in FIG. 1.

FIG. 5 is a flowchart that shows operation of the second voltage detector 5. The second voltage detector 5 is reset first (step S501) to output a signal of "L" level from an output terminal (step S502).

It is then determined if a sampling signal is input from the pulse generator 7 (step S503). If the sampling signal is input during standby (step S503: Yes), voltage of the secondary cell 2 is detected (step S504). It is determined if the voltage detected is above 2.2V (step S505). If the voltage is below 2.2V (step S505: No), a signal of "L" level is output from the output terminal (step S506), then the control returns to the step S503. At the step S505 on the other hand, if the voltage is above 2.2V (step S505: Yes), a signal of "H" level is output from the output terminal (step S507), then the control returns to the step S503. The signal of "H" level serves as an overcharge protection signal.

Figure 6:
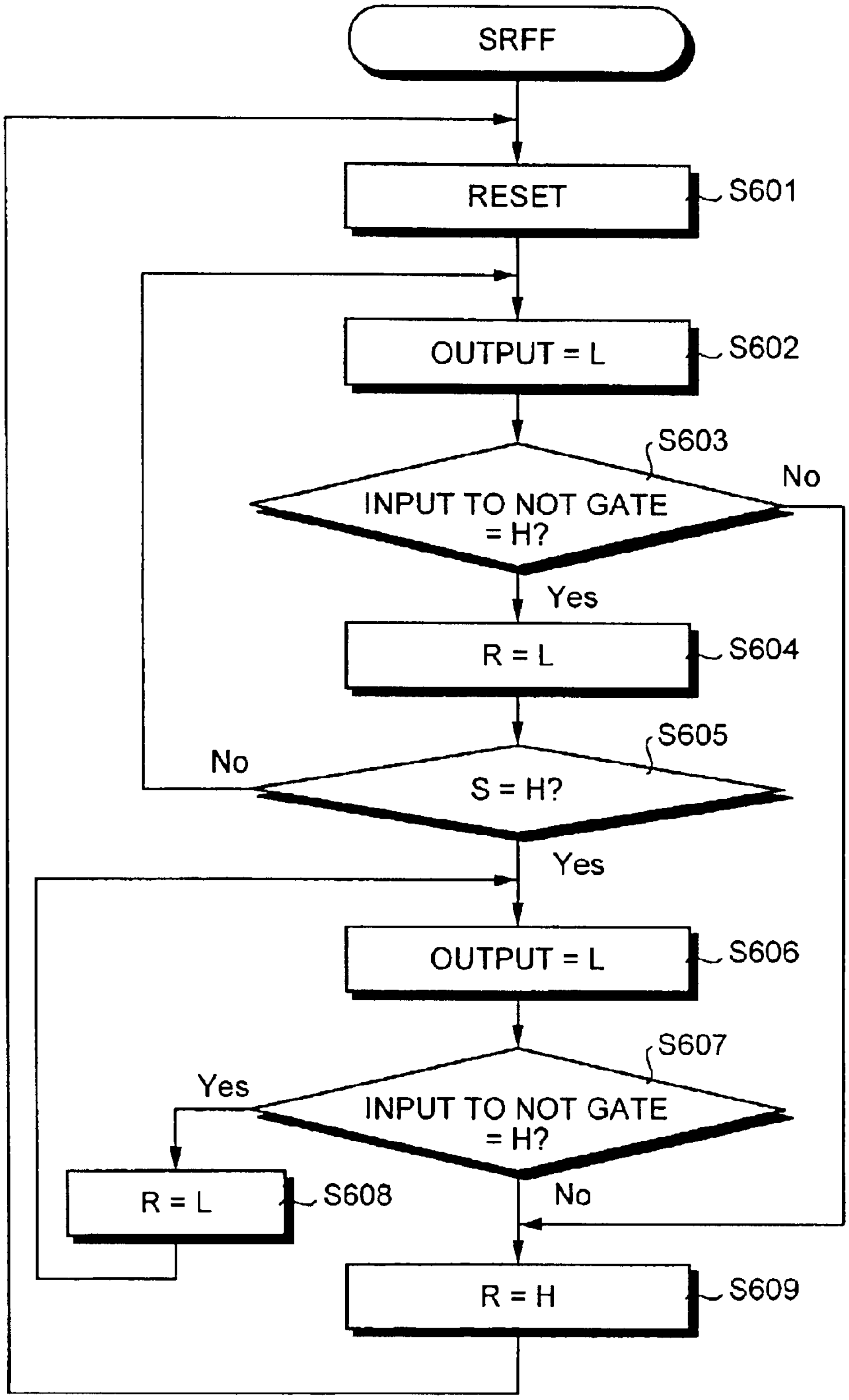
FIG. 6 is a flowchart that shows operation of a set/reset flip-flop (SRFF) in the electronic timepiece shown in FIG. 1.

Operation of the voltage detector is explained in detail. FIG. 6 is a flowchart that shows operation of the SRFF 12. The SRFF 12 is reset first (step S601) to output a signal of "L" level from an output terminal of the SRFF 12 (step S602).

It is determined next if the input to a NOT gate connected to an R terminal is a signal of "H" level, that is, if the first voltage detector 4 outputs a signal of "H" level from the c-terminal (step S603). If the input to the NOT gate is a signal of "L" level, that is, the first voltage detector 4 outputs a signal of "L" level from the c-terminal (step S603: No), a signal of "H" level is input to the R terminal (step S609). Then, the control returns to the step S601 to reset the SRFF 12 again (step S601).

At the step S603, if the input to the NOT gate is a signal of "H" level, that is, the first voltage detector 4 outputs a signal of "H" level from the c-terminal (step S603: Yes), a signal of "L" level is input to the R terminal (step S604) to cancel the reset accordingly. It is then determined if a signal of "H" level is input to a set (S) terminal, that is, the second voltage detector S outputs a signal of "H" level as the overcharge protection signal (step S605). If a signal of "L" level is input to the S terminal, that is, the second voltage detector 5 outputs a signal of "L" level (step S605: No), then the control returns to the step S602, keeping the signal output from the output terminal of the SRFF 12 at "L".

At the step S605, if a signal of "H" level is input to the S terminal, that is, if the second voltage detector 5 outputs a signal of "H" level (step S605: Yes), the SRFF 12 outputs a signal of "H" level from the output terminal to the AND gate 17 (step S606). Thereafter, if the input to the NOT gate is a signal of "H" level (step S607: Yes), the input to the R terminal is still the signal of "L" level (step S608), and the reset is cancelled. Thus, the SRFF 12 can not be reset. Thus, the SRFF 12 continuously outputs the signal of "H" level from the output terminal. On the other hand, if the input to the NOT gate turns to a signal of "L" level, that is, if the voltage on the secondary cell 2 lowers below 1.8V and the first voltage detector 4 outputs a signal of "L" level from the c-terminal (step S607: No), the input to the R terminal turns to a signal of "H" level (step S609). Then, the control returns to the step S601 to reset the SRFF 12 (step S601), which in turn outputs a signal of "L" level from the output terminal (step S602).

Figure 12:
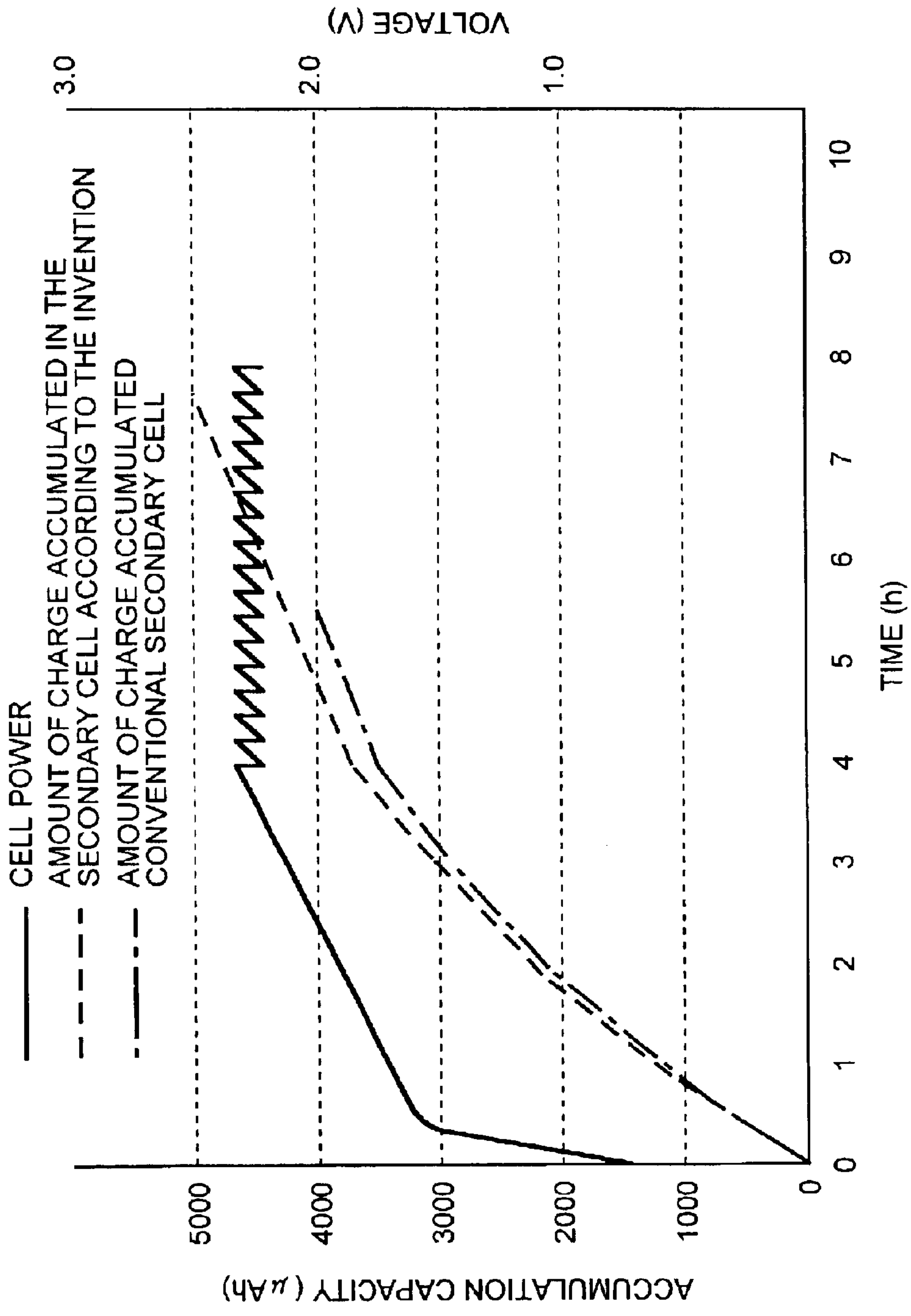
FIG. 12 shows a relation between an accumulation capacity and cell voltage with time in a secondary cell.

Until the voltage of the secondary cell 2 lowers below 1.8V after it rises to 2.2V once, the SRFF 12 continuously outputs the signal of "H" level from the output terminal. Thus, the secondary cell 2 is charged intermittently by the operation of the overcharge protector 6 after the voltage rises to 2.2V. Even if the voltage fluctuates between 2.2V and 2.1V (see FIG. 12) in response to this intermittent charging, the SRFF 12 can continuously output the signal of "H" level from the output terminal.

Figure 7:
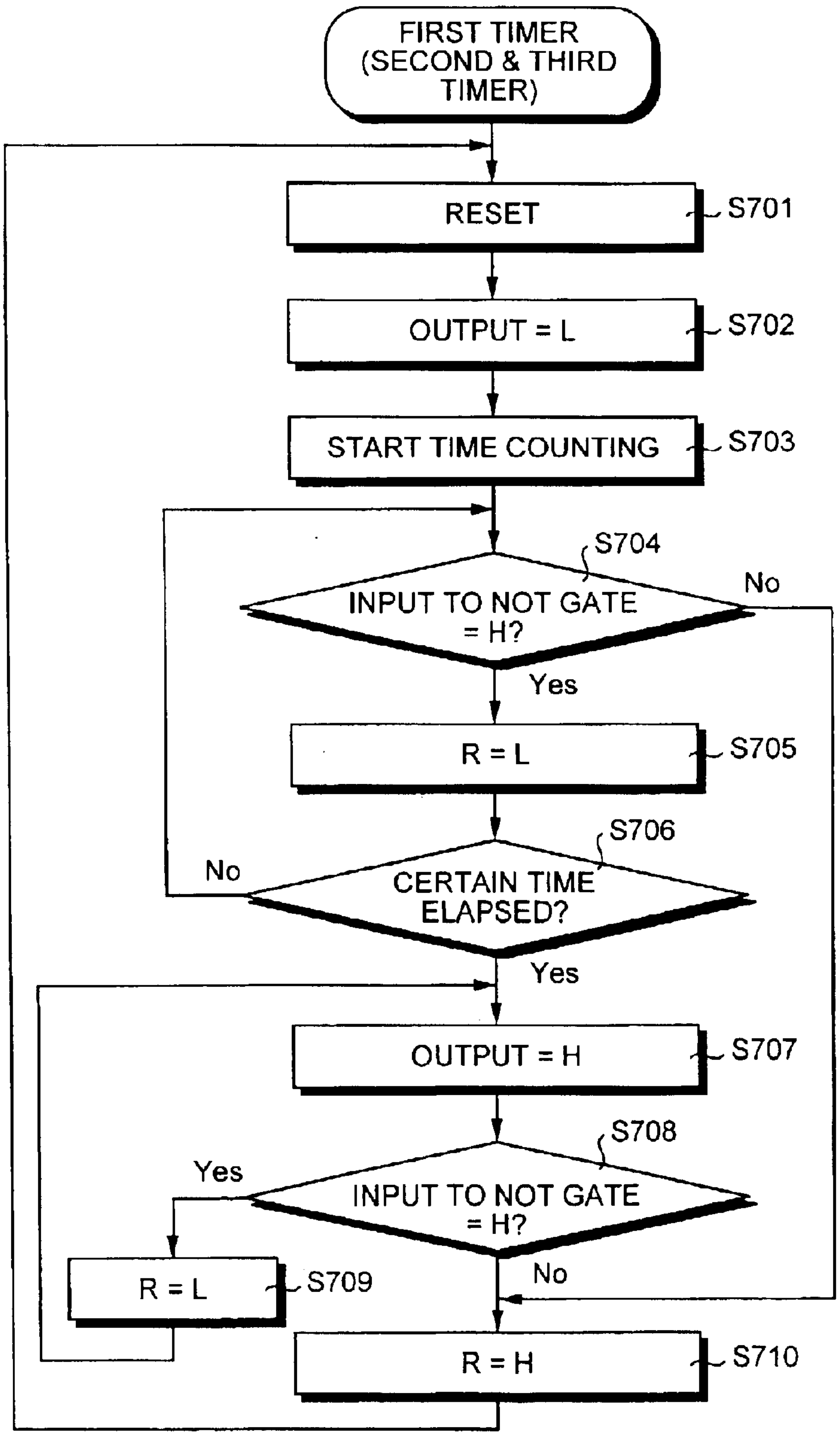
FIG. 7 is a flowchart that shows operation of timers in the electronic timepiece shown in FIG. 1.

Operations of the first timer 13, the second timer 14, and the third timer 15 are explained in detail next. The first timer 13, the second timer 14, and the third timer 15 operate in the same manner, therefore, these three timers are collectively referred to as a "timer". FIG. 7 is a flowchart that shows operation of the timer in the electronic timepiece shown in FIG. 1. The timer is reset first (step S701) to output a signal of "L" level from an output terminal of the timer (step S702) and start time counting (step S703).

It is determined next if the input to a NOT gate connected to the R terminal is a signal of "H" level, that is, if the first voltage detector 4 outputs a signal of "H" level from the a-terminal in the case of the first timer 13; if the AND gate 16 outputs a signal of "H" level from the output side in the case of the second timer 14; and if the AND gate 17 outputs a signal of "H" level from the output side in the case of the third timer 15 (step S704). If the input to the NOT gate is a signal of "L" level (step S704: No), a signal of "H" level is input to the R terminal (step S710), then the control returns to the step S701 to reset the timer again (step S701).

At the step S704, if the input to the NOT gate is a signal of "H" level (step S704: Yes), that is, if the first voltage detector 4 outputs a signal of "H" level from the a-terminal in the case of the first timer 13; if the AND gate 16 outputs a signal of "H" level from the output side in the case of the second timer 14; or if the AND gate 17 outputs a signal of "H" level from the output side in the case of the third timer 15, a signal of "L" level is input to the R terminal (step S705), and the reset is cancelled. Thus, the timer can not be reset.

It is then determined if a certain time (one hour for the first timer 13 and the second timer 14, and two hours for the third timer 15) has elapsed (step S706). If the certain time has not elapsed (step S706: No), the control returns to the step S704. If certain time has elapsed (step S706: Yes), the timer outputs a signal of "H" level from the output terminal (step S707). Thereafter, if the input to the NOT gate is a signal of "H" level (step S708: Yes), the input to the R terminal remains the signal of "L" level (step S709), and the reset is cancelled. Thus, the timer can not be reset. Accordingly, the timer continuously outputs the signal of "H" level from the output terminal (step S707).

On the other hand, at the step S708, if the input to the NOT gate turns to a signal of "L" level, that is, if the first voltage detector 4 outputs a signal of "L" level from the a-terminal in the case of the first timer 13; if the AND gate 16 outputs a signal of "L" level from the output side in the case of the second timer 14; or if the AND gate 17 outputs a signal of "L" level from the output side in the case of the third timer 15 (step S708: No), a signal of "H" level is input to the R terminal (step S710). Then, the control returns to the step S701 to reset the timer (step S701), which in turn outputs a signal of "L" level from the output terminal (step S702).

According to such the operation, after the first voltage detector 4 detects 1.2V, if it detects 1.2V or more continuously for one hour without the voltage lowered below 1.2V, the first timer 13 detects a signal of "H" level. This signal of "H" level turns on Lv1 in the accumulation condition display section 11. In addition, after the first voltage detector 4 detects 1.5V and the first timer 13 detects 1.2V or more continuously for one hour, if the first voltage detector 4 detects 1.5V or more continuously for one hour without the voltage lowered below 1.5V, the second timer 14 detects a signal of "H" level using the AND gate 16. This signal of "H" level turns on Lv2 in the accumulation condition display section 11. Therefore, Lv2 can not be turned on for at least two hours after 1.2V is detected.

Further, after the first voltage detector 4 detects 1.8V, the second timer 14 detects 1.2V or more continuously for one hour, and the SRFF 12 detects 2.2V, if the first voltage detector 4 detects 1.8V or more continuously for two hours without the voltage lowered below 1.8V, the third timer 15 detects a signal of "H" level using the AND gate 17. This signal of "H" level turns on Lv3 in the accumulation condition display section 11. Therefore, Lv3 can not be turned on for at least three hours after 1.5V is detected and at least four hours after 1.2V is detected.

A second embodiment is explained next. In the second embodiment, the same control as that in the first embodiment is executed using a program. The second embodiment is different from the first embodiment, however, in timing to turn off Lv2 and Lv3 in the accumulation condition display section 11.

Figure 8:
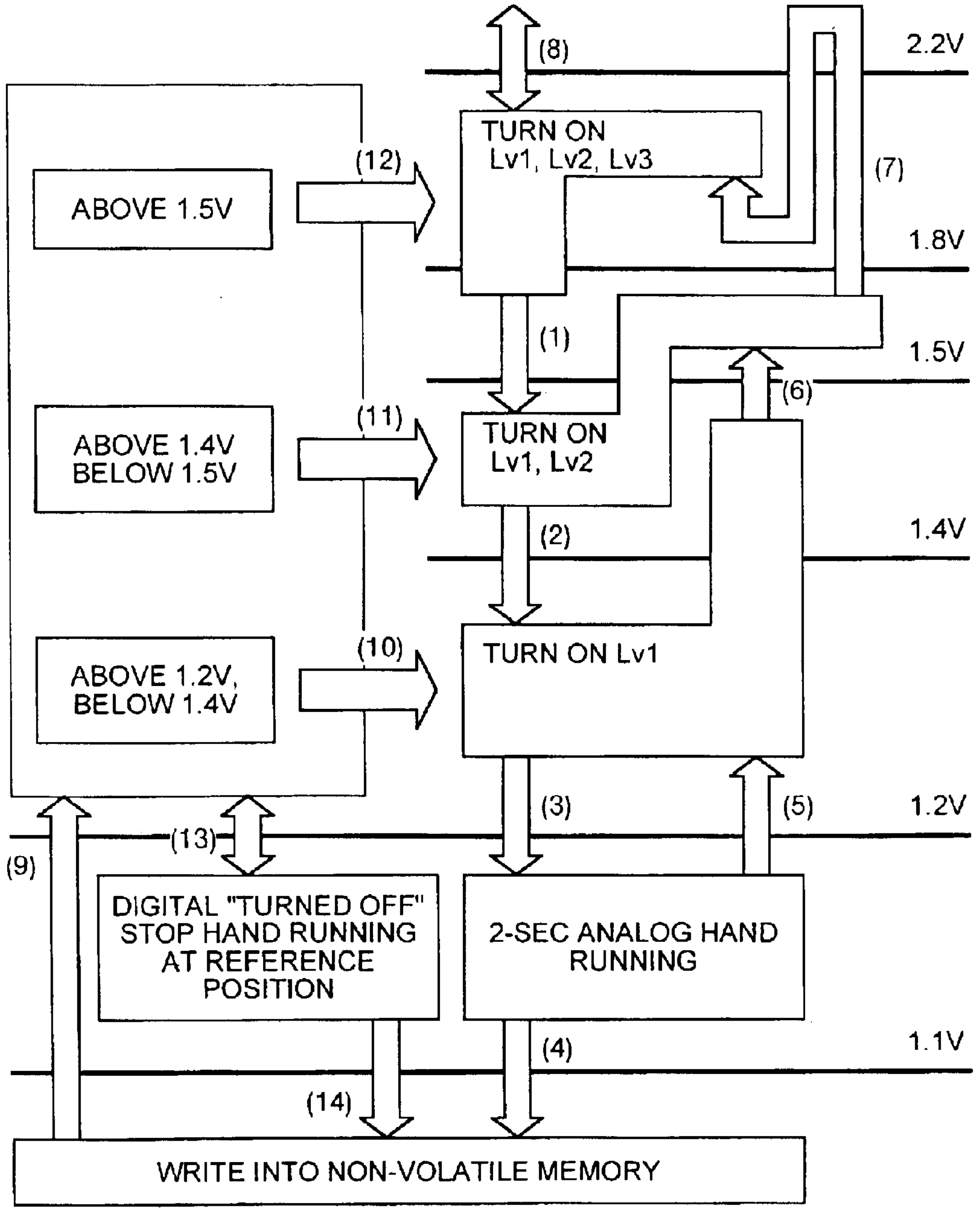
FIG. 8 is an illustrative view that shows transitions among conditions when the voltage on a secondary cell varies in the electronic timepiece shown in FIG. 1.
Figure 9:
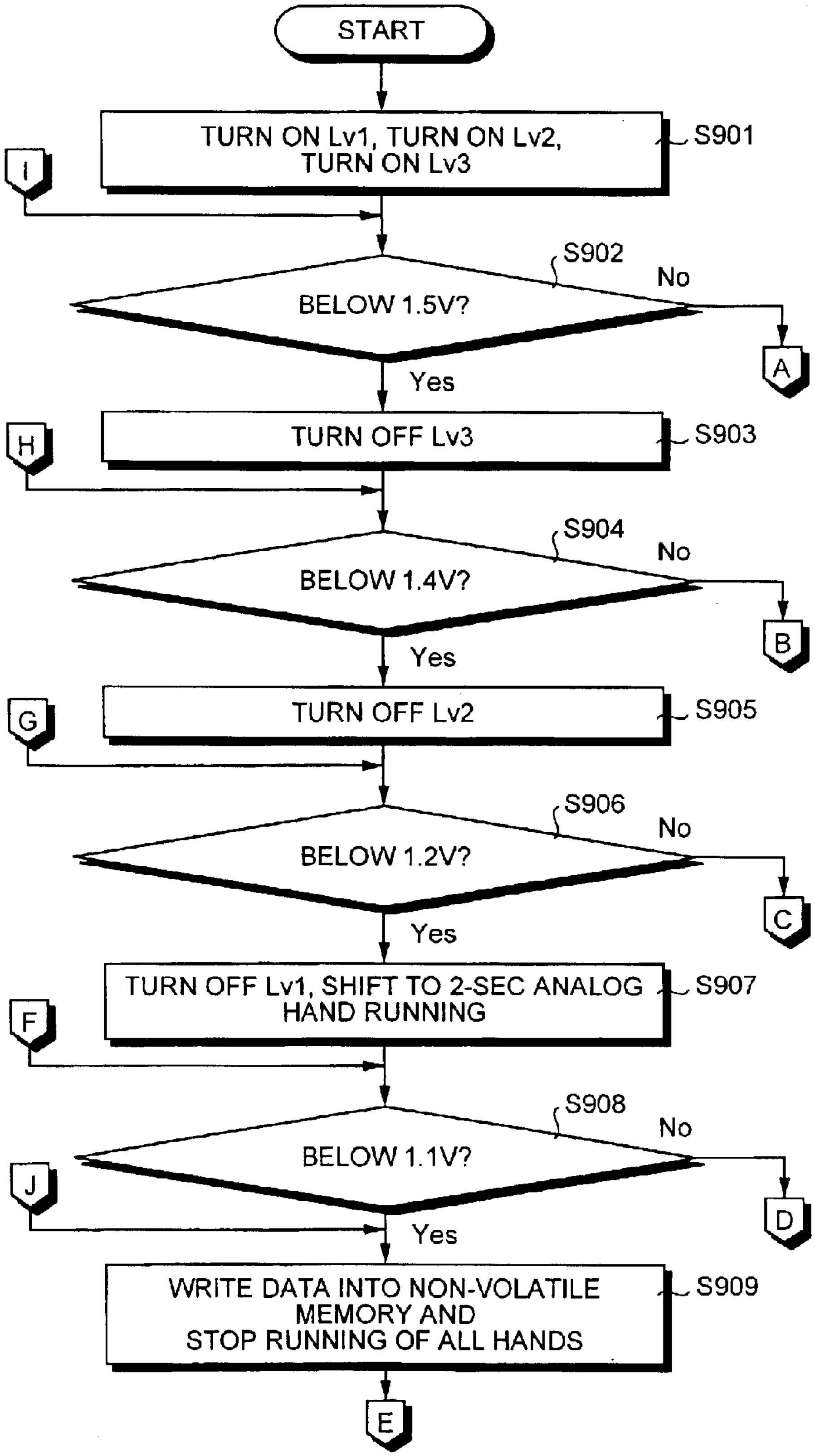
FIG. 9 is a flowchart that shows transitions among conditions when the voltage on a secondary cell varies in the electronic timepiece shown in FIG. 1.
Figure 10:
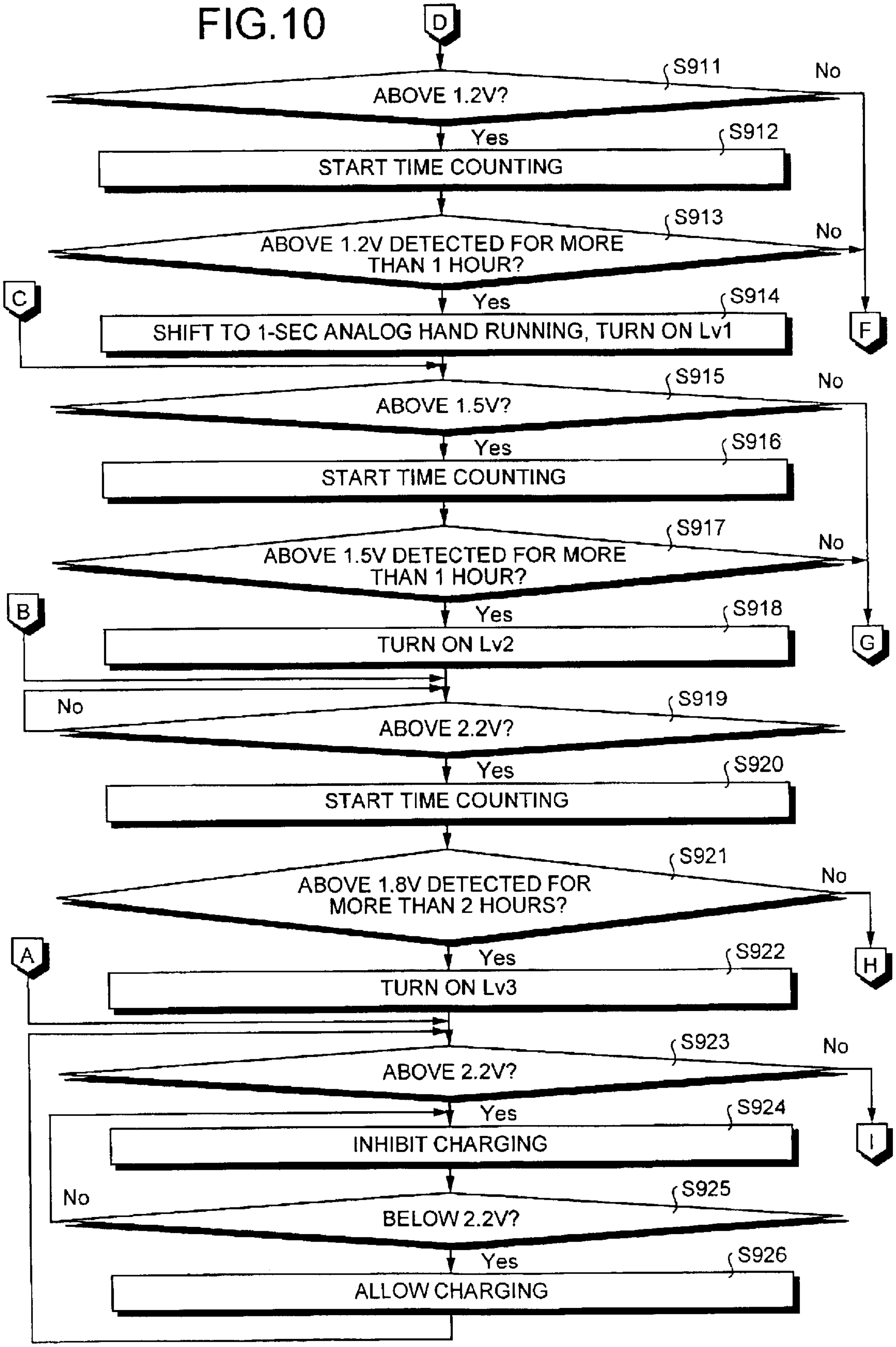
FIG. 10 is a continuation of the flowchart shown in FIG. 9.
Figure 11:
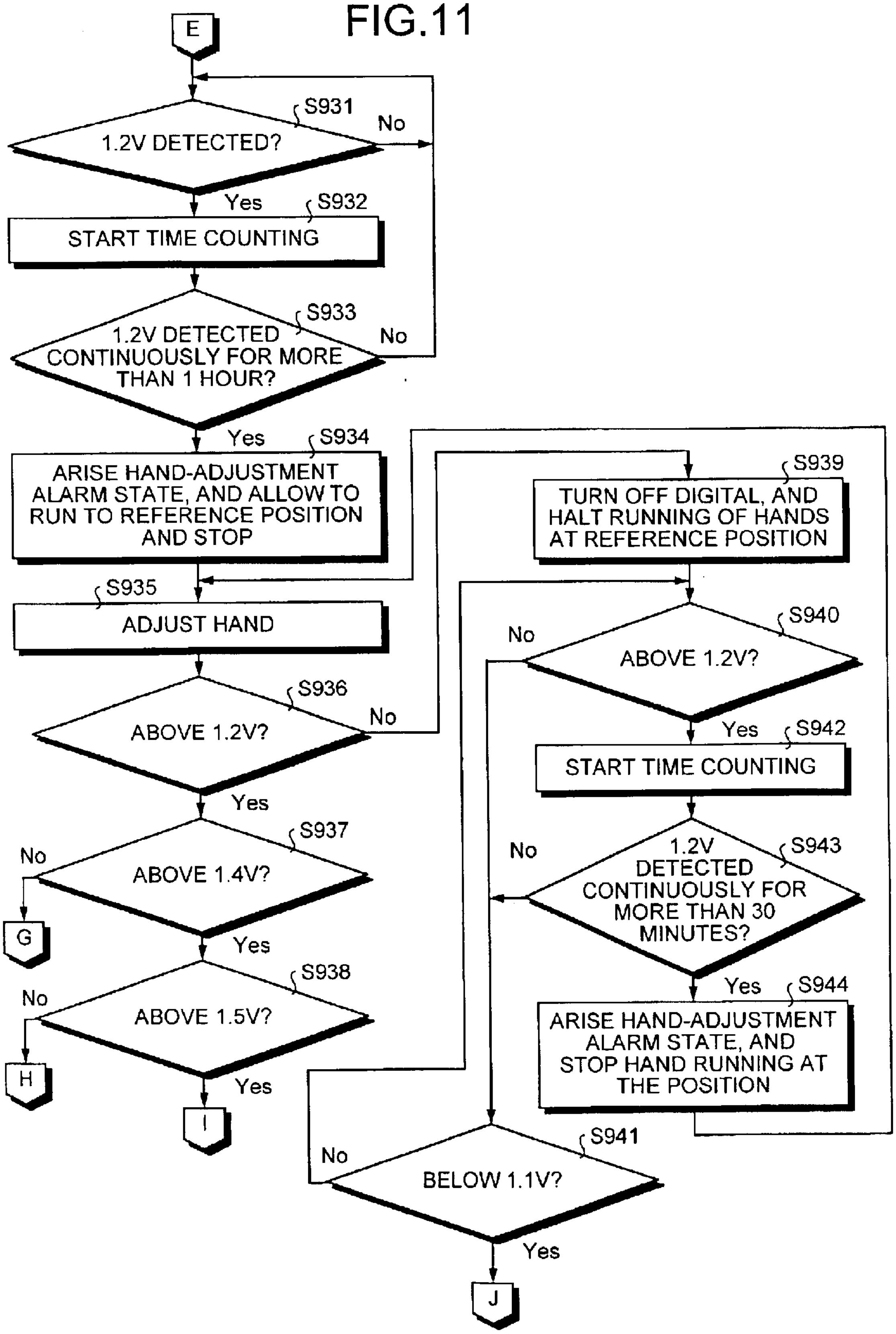
FIG. 11 is a continuation of the flowcharts shown in FIGS. 9 and 10.

Transitions among conditions occur when the voltage on the secondary cell varies in the electronic timepiece shown in FIG. 1. They are explained first. FIG. 8 is an illustrative view that shows transitions among conditions when the voltage on the secondary cell varies in the electronic timepiece shown in FIG. 1. FIGS. 9, 10, and 11 are flowcharts that show transitions among conditions when the voltage on the secondary cell varies in the electronic timepiece shown in FIG. 1. In FIG. 8, Lv1, Lv2, and Lv3 in the accumulation condition display section 11 are all in a state of turned-on, which is explained first.

When Lv1, Lv2, and Lv3 all stay turned on (step S901 in FIG. 9), it is determined the voltage detected of the secondary cell 2 is below 1.5V (step S902). If the voltage is below 1.5V (step S902: Yes), Lv3 is turned off and only Lv1 and Lv2 stay turned on (step S903: Transition (1)). If the voltage below 1.5V is not detected (step S902: No), the control jumps to the step S923 shown in the flowchart of FIG. 10.

It is then determined if the voltage of the secondary cell 2 is below 1.4V (step S904). If the voltage is below 1.4V (step S904: Yes), Lv2 is also turned off and only Lv1 stays on (step S905: Transition (2)). If the voltage is not below 1.4V (step S904: No), the control jumps to the step S919 shown in the flowchart of FIG. 10.

It is determined next if the voltage of the secondary cell 2 is below 1.2V (step S906). If the voltage is below 1.2V (step S906: Yes), Lv1 is also turned off, and an analog hand is allowed to run every two seconds (step S907: Transition (3)). If the voltage is not below 1.2V (step S906: No), the control jumps to the step S915 shown in the flowchart of FIG. 10.

It is then determined if the voltage of the secondary cell 2 is below 1.1V (step S908). If the voltage is below 1.1V (step S908: Yes), necessary data is written into a non-volatile memory, not shown, and running of all hands is halted (step S909: Transition (4)). Then, the control jumps to the step S931 shown in the flowchart of FIG. 11.

As shown in FIG. 10, it is determined if the voltage of the secondary cell 2 is above 1.2V (step S911). If the voltage is above 1.2V (step S911: Yes), time counting is started (step S912). It is then determined if the voltage of the secondary cell 2 is continuously above 1.2V for one hour (step S913). If the voltage of the secondary cell 2 is above 1.2V continuously for a span of one hour (step S913: Yes), the analog hand is allowed to run every one second, and Lv1 is turned on (step S914: Transition (5)). If the voltage is not below 1.2V (step S911: No) or if the voltage is not above 1.2V continuously for a span of one hour (step S913: No), the control jumps to the step S908 shown in the flowchart of FIG. 9.

It is determined next if the voltage of the secondary cell 2 is above 1.5V (step S915). If the voltage is above 1.5V (step S915: Yes), time counting is started (step S916). It is then determined if the voltage is above 1.5V continuously for a span of one hour (step S917). If the voltage is above 1.5V continuously for a span of one hour (step S917: Yes), Lv2 is turned on (step S918: Transition (6)). Thus, Lv1 and Lv2 both stay turned on. If the voltage is below 1.5V (step S915: No) or if the voltage is not above 1.5V continuously for a span of one hour (step S917: No), the control jumps to the step S906 shown in the flowchart of FIG. 9.

It is determined next if the voltage of the secondary cell 2 is above 2.2V (step S919). If the voltage is above 2.2V during standby (step S919: Yes), time counting is started (step S920). It is then determined if the voltage is above 1.8V continuously for a span of two hours (step S921). If the voltage is above 1.8V continuously for a span of two hours (step S921: Yes), Lv3 is turned on (step S922: Transition (7)). Thus, Lv1, Lv2, and Lv3 all stay turned on. If the voltage is not above 1.8V continuously for a span of two hours (step S921: No), the control jumps to the step S904 shown in the flowchart of FIG. 9.

It is further determined if the voltage of the secondary cell 2 is above 2.2V (step S923). If the voltage is above 2.2V (step S923: Yes), the overcharge protector is employed to inhibit charging (step S924: Transition (8)). The charging inhibition is continued until the voltage drops below 2.2V. If the voltage drops below 2.2V (step S925: Yes), the overcharge protector is allowed to restart the charging that was once inhibited (step S926: Transition (8)), and the control returns to the step S923. The processes at the steps S923 to S926 are repeated hereinafter. At the step S923, if the voltage is not above 2.2V (step S923: No), the control jumps to the step S902 shown in FIG. 9.

In FIG. 11, after necessary data is written into a non-volatile memory (not shown) running of all hands is halted (step S909: Transition (4)). It is then determined if the voltage of the secondary cell 2 is 1.2V (step S931). If the voltage is 1.2V during standby (step S931: Yes), time counting is started (step S932). It is determined next if the voltage of the secondary cell 2 is 1.2V continuously for a span of one hour (step S933). If the voltage is not 1.2V continuously for a span of one hour (step S933: No), the control returns to the step S931.

At the step S933, if the voltage is 1.2V continuously for a span of one hour (step S933: Yes), a hand-adjustment alarm state arises, and the hand is allowed to run to the reference position and stop (step S934: Transition (9)). Then, the hand is adjusted (step S935). Thereafter, it is determined whether the voltage of the secondary cell 2 is above 1.2V, above 1.4V, and above 1.5V (steps S936, S937 and S938).

If the voltage is above 1.2V (step S936: Yes) and below 1.4V (step S937: No), the control jumps to the step S906 shown in the flowchart of FIG. 9 (Transition (10)). If the voltage is above 1.4V (step S937: Yes) and below 1.5V (step S938: No), the control jumps to the step S904 shown in the flowchart of FIG. 9 (Transition (11)). If the voltage is above 1.5V (step S938: Yes), the control jumps to the step S902 shown in the flowchart of FIG. 9 (Transition (12)).

At the step S936, if it is determined that the voltage of the secondary cell 2 is below 1.2V (step S936: No), digital indications of the electronic timepiece are turned off, and running of the hands is halted at the reference position (step S939: Transition (13)). It is then determined if the voltage of the secondary cell 2 has rises to above 1.2V (step S940). If the voltage is above 1.2V (step S940: Yes), time counting is started (step S942). It is then determined if the voltage is above 1.2V continuously for a span of 30 minutes or more (step S943). If the voltage is above 1.2V continuously for a span of 30 minutes or more (step S943: Yes), a hand-adjustment alarm state arises, and the hand is stopped at that position (step S944). Then, the control moves to the step S935 (Transition (13)).

On the other hand, if it is determined that the voltage is below 1.2V at the step S940 (step S940: No) or that the voltage is not above 1.2V continuously for a span of 30 minutes or more at the step S942 (step S943: No), it is determined if the voltage is below 1.1V (step S941). If the voltage is not below 1.1V (step S941: No), the control returns to the step S940. On the other hand, if the voltage is below 1.1V (step S941: Yes), the control jumps to the step S909 shown in the flowchart of FIG. 9 (Transition (14)).

As explained above, according to the first and second embodiments, the electronic timepiece comprises a secondary cell 2; a power generator 1 as a power supplier that supplies power to the secondary cell 2; a first voltage detector 4 that detects a plurality of voltages including a certain voltage (for example, 1.2V) on the secondary cell 2 electrically supplied from the power generator 1; a first timer 13 that counts a time of continuous detection by the first voltage detector 4 associated with voltages above 1.2V; a second timer 14 that, after a point in time when the time counted at the first timer 13 reaches a certain time (for example, one hour), counts a certain time (for example, one hour); and an accumulation condition display section 11 that displays an accumulated condition of the secondary cell 2 based on the one hour counted at the first timer 13 and the one hour counted at the second timer 14. Therefore, when a voltage on a secondary cell is detected to estimate an accumulated condition using the detected voltage, it is not influenced from sharp fluctuations of the voltage.

According to the first and second embodiments, the accumulation condition display section 11 includes display areas respectively corresponding to the first timer 13, the second timer 14, and the third timer 15. It turns on the display area Lv1 when one hour is counted at the first timer 13, the display area Lv2 when one hour is counted at the second timer 14, and the display area Lv3 when two hours are counted at the third timer 15. Thus, a display area is turned on to indicate an accumulated condition. Therefore, the accumulated condition can be identified easily. The accumulation condition display section 11 may comprise a liquid crystal display screen. This is effective to perform display at reduced power consumption together with other digital displays.

According to the first and second embodiments, the second timer 14 counts a time of continuous detection by the first voltage detector 13 associated with voltages above a voltage higher than 1.2V (for example, 1.5V), after the point in time when the time counted at the first timer 13 reaches one hour. Therefore, when a voltage on a secondary cell is detected to estimate an accumulated condition using the detected voltage, it is possible to prevent an erroneous display from occurring possibly when the voltage on the secondary cell is not elevated. Such the erroneous display occurs, for example, when Lv2 is turned on even though the voltage on the secondary cell does not exceed 1.5V.

According to the first and second embodiments, the electronic timepiece further comprises an overcharge protector 6 that prevents the power generator 1 from supplying overpower to the secondary cell 2 when the voltage detected by the first voltage detector 4 reaches 2.2V; and a third timer 15 that counts two hours after a point in time when the voltage reaches 2.2V. The accumulation condition display section 11 turns on Lv3 in the accumulation condition display section 11 based on the two hours counted at the third timer 15. Therefore, when a voltage on a secondary cell is detected to estimate an accumulated condition using the detected voltage, it is possible to prevent an erroneous display from occurring possibly when the detected voltage reaches a value (2.2V) associated with the overpower supply. Such the erroneous display occurs, for example, when the detected voltage exceeds 2.2V and Lv3 (full-charge) is indicated even though the cell is not fully charged.

According to the first and second embodiments, the third timer 15 counts a time of continuous detection associated with voltages above a certain voltage lower than 2.2V (for example, 1.8V), after the point in time when the detected voltage reaches 2.2V. Therefore, when a voltage on a secondary cell is detected to estimate an accumulated condition using the detected voltage, it is possible to prevent an erroneous display from occurring possibly along with voltage fluctuations when the overpower supply is prevented. Such the erroneous display occurs, for example, if fluctuations in voltage are caused when the overcharge protector 6 repeats action/stop. In this case, when the detected voltage lowers below 2.2V, the third timer 15 is reset. Therefore, the third timer 15 can not count two hours for any length of time and Lv3 can not be indicated even though the cell is fully charged.

According to the first and second embodiments, the overcharge protector 6 prevents the power generator 1 from supplying overpower to the secondary cell 2 while the voltage detectors 4 and 5 still detect any voltages. Therefore, it is possible to detect a voltage on the secondary cell 2 precisely.

According to the first and second embodiments, a full-charge indication associated with the secondary cell 2, that is, indication of Lv3 is performed based on the time counted at the third timer 15. Therefore, it is possible to display a full-charge indication precisely.

The method of displaying an accumulated condition of a secondary cell according to the embodiment may employ a previously prepared program that can be read in an information-processing terminal. The method can be achieved when the program is executed in the information-processing terminal or in the electronic timepiece. The program is recorded in a recording medium such as Hard Disk (HD), Floppy Disk (FD), Compact Disk Read-Only Memory (CD-ROM), Magnetooptic disk (MO) and Digital Versatile Disc (DVD) readable from the information-processing terminal. The program can be executed when the information-processing terminal reads it out of the recording medium. The program may be a transmission medium that can be distributed over a network such as the Internet.

The electronic timepiece exemplified in the embodiments may be a wristwatch and a table timepiece alternatively. The present invention is not limited in the electronic timepiece but rather applicable to information-processing terminals such as cell phones, PDAs (Personal Digital Assistant), note-type personal computers, and various measuring instruments.

As explained above, according to the present invention, when a voltage on a secondary cell is detected to estimate an accumulated condition using the detected voltage, it is not influenced from sharp fluctuations of the voltage. Therefore, it is possible to effectively achieve an electronic timepiece, method of and program for displaying an accumulated condition of a secondary cell, and information-processing terminal, that can display an accumulated condition of a secondary cell reliably with a simple arrangement.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An electronic timepiece comprising:

a secondary cell;

a power supplier that supplies power to the secondary cell;

a voltage detector that detects a voltage of the secondary cell;

a first timer that counts the time during the voltage of the secondary cell is equal to or higher than a first voltage continuously;

a second timer that starts counting time from an instant when the time counted by the first timer reaches a first time and counts the time until a second time; and a display unit that displays a charge accumulated condition of the secondary cell based on the time counted by the second timer reaches the second time.

2. The electronic timepiece according to claim 1, wherein the display unit includes display areas corresponding to the first timer and the second timer, wherein the display unit turns on the corresponding one of the display areas when the first time is counted by the first timer or when the second time is counted by the second timer.

3. The electronic timepiece according to claim 2, wherein the display unit comprises a liquid crystal display.

4. The electronic timepiece according to claim 1, wherein after the time counted by the first timer has reached the first time, the second timer counts the time during the voltage of the secondary cell is equal to or higher than the second voltage continuously until an instant when the time is equal to the second time, second voltage being higher than the first voltage.

5. The electronic timepiece according to claim 1, further comprising:

a power cut unit that cuts the power supply from the power supplier to the secondary cell when the voltage of the secondary cell reaches a third voltage, the third voltage being higher than the first voltage; and a third timer that starts counting time from an instant when the voltage of the secondary cell has reached the third voltage until a third time, wherein the display unit displays the charge accumulated condition of the secondary cell based on at least whether any one of the time counted by the first timer reaches the first time, the second timer reaches the second time, and the third timer reaches the third time.

6. The electronic timepiece according to claim 5, wherein the third timer starts counting a time from the instant when the voltage of the secondary cell has reached the third voltage and lasts until an instant when the voltage of the secondary cell is lower than a fourth voltage, the fourth voltage being lower than the third voltage.

7. The electronic timepiece according to claim 5, wherein the power cut unit cuts the power supply while the voltage detector is detecting the voltage of the secondary cell.

8. The electronic timepiece according to claim 5, wherein the display unit displays a full-charge indication associated with the secondary cell based on the third time counted by the third timer.

9. The electronic timepiece according to claim 1, wherein the power supplier comprises a photovoltaic power generator.

10. A method of displaying an amount of charge accumulated in a secondary cell, comprising:

detecting a voltage of the secondary cell;

a first step of counting the time during the voltage of the secondary cell is equal to or higher than a first voltage continuously;

a second step of starting counting of time from an instant when the time counted in the first step has reached a first time and counting the time until a second time; and displaying the amount of charge accumulated in the secondary cell based on the time counted by the second timer reaches the second time.

11. The method according to claim 10, wherein after the time counted at the first step has reached the first time, the time counted at the second step is a time which is counted during the voltage of the secondary cell is equal to or higher than a second voltage continuously until an instant when the time is equal to the second time, the second voltage being higher than the first voltage.

12. The method according to claim 10, further comprising:

cutting a power supply to the secondary cell when the voltage of the secondary cell reaches a third voltage, the third voltage being higher than the first voltage; and a third step of starting counting of a time from an instant when the voltage of the secondary cell has reached the third voltage until a third time, wherein at the step of displaying, the amount of charge accumulated in the secondary cell is displayed based on at least whether any one of the time counted by the first timer reaches the first time, the second timer reaches the second time, and the third timer reaches the third time.

13. The method according to claim 12, wherein the third time counted at the third step is a time that is started to be counted from the instant when the voltage of the secondary cell has reached the third voltage and lasts until an instant when the voltage of the secondary cell is lower than a fourth voltage, the fourth voltage being lower than the third voltage.

14. A computer program containing instructions which when executed on a computer realize a method of displaying an amount of charge accumulated in a secondary cell, the method comprising:

detecting a voltage of the secondary cell;

a first step of counting the time during the voltage of the secondary cell is equal to or higher than a first voltage continuously;

a second step of starting counting of time from an instant when the time counted in the first step has reached a first time and counting the time until a second time; and displaying the amount of charge accumulated in the secondary cell based on the time counted by the second timer reaches the second time.

* * * * *